US010181284B2

(12) United States Patent
Yin et al.

(10) Patent No.: US 10,181,284 B2
(45) Date of Patent: Jan. 15, 2019

(54) PIXEL DRIVING CIRCUIT AND REPAIRING METHOD THEREOF AND DISPLAY APPARATUS

(71) Applicant: BOE TECHNOLOGY GROUP CO., LTD., Beijing (CN)

(72) Inventors: Jingwen Yin, Beijing (CN); Cuili Gai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/916,349

(22) PCT Filed: Sep. 24, 2015

(86) PCT No.: PCT/CN2015/090555
§ 371 (c)(1),
(2) Date: Mar. 3, 2016

(87) PCT Pub. No.: WO2016/145819
PCT Pub. Date: Sep. 22, 2016

(65) Prior Publication Data
US 2016/0268364 A1 Sep. 15, 2016

(30) Foreign Application Priority Data
Mar. 13, 2015 (CN) .......................... 2015 1 0112627

(51) Int. Cl.
*H01L 27/32* (2006.01)
*G09G 3/3233* (2016.01)

(52) U.S. Cl.
CPC ... *G09G 3/3233* (2013.01); *G09G 2300/0804* (2013.01); *G09G 2300/0819* (2013.01); *G09G 2330/08* (2013.01)

(58) Field of Classification Search
CPC ......... G09G 3/3233; G09G 2300/0804; G09G 2300/0819; G09G 2330/08
(Continued)

(56) References Cited

U.S. PATENT DOCUMENTS

2006/0017674 A1* 1/2006 Kamada ............ G02F 1/136259 345/87
2008/0116501 A1* 5/2008 Lin ....................... H01L 27/124 257/315
2009/0213049 A1* 8/2009 McCreary ............ G09G 3/3233 345/80
2011/0109299 A1* 5/2011 Chaji ................... G09G 3/3283 324/76.11
2014/0319486 A1* 10/2014 Hong ....................... G09G 3/32 257/40

FOREIGN PATENT DOCUMENTS

CN 102707467 A 10/2012
CN 103235428 A 8/2013
(Continued)

OTHER PUBLICATIONS

Search Report and Written Opinion dated Nov. 25, 2015 from State Intellectual Property Office of the P.R. China.
(Continued)

*Primary Examiner* — Bo Fan
(74) *Attorney, Agent, or Firm* — Dilworth & Barrese, LLP.; Michael J. Musella, Esq.

(57) ABSTRACT

There are provided a driving circuit and a repairing method thereof, and a display apparatus. The driving circuit comprises: a driving transistor (T1), whose first terminal is input a power supply signal (Vdd), second terminal is connected to a display unit (10), and control terminal is input a data signal (Vdata). The driving circuit further comprises: a standby driving unit (11) including a standby transistor (T3), a first capacitor (C1) and a second capacitor (C2), a first terminal of the standby driving transistor (T3) is input the power supply signal (Vdd), a second terminal thereof is connected to the display unit (10) through the first capacitor (C1), and a control terminal thereof is connected to the control terminal of the driving terminal (T1) or the first
(Continued)

terminal of the driving transistor (T1) through the second capacitor (C2). When abnormality occurs to the driving transistor (T1), it is able to make the pixel operate normally by means of a repairing approach, so that display effect of the display panel can be enhanced and production yield of the display panel is enhanced.

12 Claims, 3 Drawing Sheets

(58) Field of Classification Search
USPC ..................................... 257/40, 315; 345/87
See application file for complete search history.

(56) References Cited

FOREIGN PATENT DOCUMENTS

| | | |
|---|---|---|
| CN | 104637450 A | 5/2015 |
| CN | 104678667 A | 6/2015 |

OTHER PUBLICATIONS

Chinese Office Action dated Dec. 31, 2015.
Chinese Office Action dated Jun. 24, 2016.

* cited by examiner

PIXEL DRIVING CIRCUIT AND REPAIRING METHOD THEREOF AND DISPLAY APPARATUS

TECHNICAL FIELD

The present disclosure relates to a pixel driving method and repairing method thereof, and a display apparatus.

BACKGROUND

An active matrix organic light emitting diode (AMOLED) display is more suitable to performance requirements of displays in an age of multimedia due to its advantages of non-angle limitation, low manufacturing cost, high response speed (approximately more than hundred times of a liquid crystal display), power saving, self-luminescent, direct current driving applicable to portable devices, wide range of operating temperature, light weight and becoming smaller and thinner according to the hardware devices and so on. Therefore, the AMOLED display has great potential for development, and is expected to take place of the liquid crystal display to become a younger generation of a new-type flat panel display.

Each pixel of the AMOLED display is constituted of three sub-pixels, i.e., red, green and blue, or four sub-pixels, i.e., red, green, blue and white. Each sub-pixel has its respective driving circuit correspondingly. People's requirement for display effect becomes higher and higher, resolution is increasingly rising, and device configuration of each pixel is closer and closer. As a result, the driving circuit would be damaged easily in massive industrial production due to situations such as instability of manufacturing environment and process, high current, etc., thereby causing a certain sub-pixel fails to operate normally. Then, a corresponding pixel would be lack of a color unit, such that bright points or dark points occur in the case of displaying. All of these belong to display defects, would reduce display quality, and have a great influence on the display effect.

SUMMARY

There are provided in the present disclosure a pixel driving circuit and a repairing method thereof, and a display apparatus, which are capable of making pixels operate normally by means of repairing when abnormal circumstance occur to a driving transistor, so that display effect of a display panel can be raised and production yield of the display panel is enhanced.

There is provided in an embodiment of the present disclosure a pixel driving circuit, comprising: a driving transistor, whose first terminal is input a power supply signal, second terminal is connected to a display unit, and control terminal is input a data signal, and further comprising: a standby driving unit including a standby transistor, a first capacitor and a second capacitor, wherein a first terminal of the standby driving transistor is input the power supply signal, a second terminal thereof is connected to the display unit through the first capacitor, and a control terminal thereof is connected to the control terminal of the driving transistor or the first terminal of the driving transistor though the second capacitor.

Optionally, the display unit is an organic light-emitting diode.

There is provided a display panel, comprising a plurality of pixels, each of which includes a plurality of sub-pixels, one display unit being arranged within each of the sub-pixels and the driving circuit being also arranged within the sub-pixel for driving the display unit.

Alternatively, two or more adjacent sub-pixels share one standby driving unit.

More alternatively, the two adjacent sub-pixels share one standby driving unit; a display unit in the two adjacent sub-pixels is connected to a second terminal of the standby driving transistor in a shared standby driving unit through one first capacitor respectively; a control terminal of a driving transistor in the two adjacent sub-pixels is connected to the control terminal of the standby driving transistor in the shared standby driving unit through one second capacitor respectively, or a first terminal of a driving transistor in the two adjacent sub-pixels is connected to the control terminal of the standby driving transistor in the shared standby driving unit through one second capacitor respectively.

There is further provided in an embodiment of the present disclosure a repairing method of the display panel described above, which is applicable to poor display caused by that a pixel driving circuit cannot operate normally due to occurrence of abnormality to the driving transistor, comprising:

disconnecting a first terminal of the driving transistor where abnormality occurs from wiring of power supply signal terminal by means of laser cutting, and disconnecting a second terminal of the driving transistor where abnormality occurs from a display unit, the wiring of power supply signal terminal being used to input a power supply signal to the driving transistor;

welding two electrode plates of a first capacitor together and welding two electrode plates of a second capacitor together by means of laser welding; and it further needs to weld a control terminal of the driving transistor and the first terminal of the driving transistor together if a control terminal of the standby driving transistor is connected to the first terminal of the driving transistor through the second capacitor.

Alternatively, the display panel is formed by box aligning of an array substrate and a protection substrate; the laser cutting or the laser welding is performed at one side of the array substrate.

There are provided in the present disclosure a pixel driving circuit and a repairing method thereof, and a display apparatus. A standby driving unit is added on the basis of the existing driving circuit. The standby driving unit comprises: a standby driving transistor, a first capacitor and a second capacitor, wherein a first terminal of the standby driving transistor is input a power supply signal, a second terminal thereof is connected to a display unit through the first capacitor, a control terminal thereof is connected to a control terminal of a driving transistor or a first terminal of the driving transistor through the second capacitor. In the case that abnormality occurs to the driving transistor, the first capacitor and the second capacitor are short-circuited by means of repairing. In this way, the standby driving transistor in the standby driving unit can take place of the original transistor to operate, thereby making pixels operate normally, so that display effect of the display panel can be raised and production yield of the display panel is enhanced.

DETAILED DESCRIPTION

Technical solutions in embodiments of the present disclosure will be described clearly and completely by combing with figures. Obviously, the embodiments described below are just a part of embodiments of the present disclosure, but not all of the embodiments. Based on the embodiments of the present disclosure, all of other embodiments obtained by those ordinary skilled in the art without paying any inventive work belong to the protection scope of the present disclosure.

Figure 1:
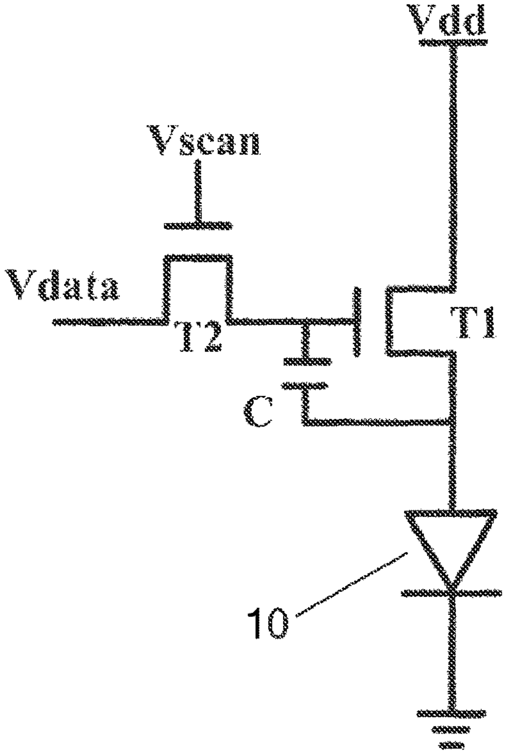
FIG. 1 is a schematic diagram of a sub-pixel driving circuit of a conventional active organic light emitting diode driving display.

FIG. 1 is a sub-pixel driving circuit of a conventional active organic light emitting diode driving (AMOLED) display. As shown in FIG. 1, the driving circuit mostly adopts a 2T1C structure, i.e., comprising two thin film transistors T1 and T2, and one storage capacitor C. Generally, the driving circuit drives a display unit 10 to emit light under the control of a scanning signal Vscan and a data signal Vdata, while luminance presented by the display unit 10 is proportional to intensity of the data signal Vdata.

In actual situation, the driving circuit would be damaged easily in massive industrial production due to situations such as instability of manufacturing environment and process, high current, etc., thereby causing a certain sub-pixel fails to operate normally. Then, a corresponding pixel would be lack of a color unit, such that bright points or dark points occur in the case of displaying. All of these belong to display defects.

Figure 2:
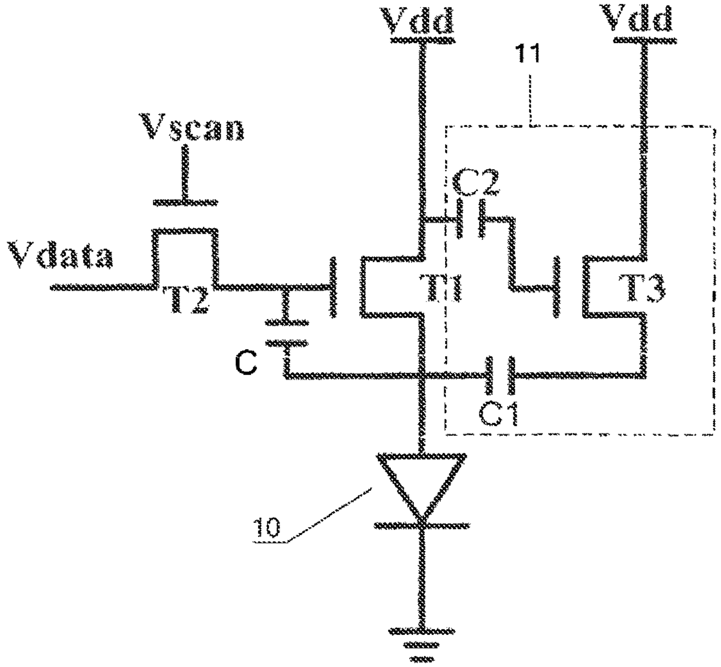
FIG. 2 is a schematic diagram of a pixel driving circuit provided in an embodiment of the present disclosure.

The embodiments of the present disclosure propose a repairable pixel driving circuit with respect to such deficiencies. FIG. 2 shows a schematic diagram of a pixel driving circuit provided in an embodiment of the present disclosure. As shown in FIG. 2, this pixel driving circuit comprises: a driving transistor T1, whose first terminal is input a power supply signal Vdd, second terminal thereof is connected to the display unit 10, and control terminal thereof is input the data signal Vdata. The driving circuit can further comprise: a standby driving unit 11. Exemplarily, the standby driving unit 11 can comprise: a standby driving transistor T3, a first capacitor C1 and a second capacitor C2. A first terminal of the standby driving transistor T3 is input the power supply signal Vdd, a second terminal thereof is connected to the display unit 10 through the first capacitor C1, and a control terminal thereof is connected to the first terminal of the driving transistor T1 through the second capacitor C2.

In the pixel driving circuit provided in the embodiment of the present disclosure, a switching transistor T2, the driving transistor T1, the storage capacitor C and the display unit 10 constitutes a sub-pixel driving unit. Optionally, the display unit 10 is an organic light emitting diode OLED. Additionally, the standby driving transistor T3, the first capacitor C1 and the second capacitor C2 constitutes a sub-pixel standby driving unit 11. Compared with the storage capacitor C, values of the first capacitor C1 and the second capacitor C2 are much smaller, and thus its influence on the operating process of the entire driving circuit is almost negligible. Normally, the sub-pixel driving unit operates. When abnormal circumstance occurs to the driving transistor T1, two electrode plates of the first capacitor C1 are short-circuited and two electrode plates of the second capacitor C2 are short-circuited by means of repairing approach, and the first terminal and control terminal of the driving transistor T1 are short-circuited. At this time, the standby driving transistor T3 can take place of the original driving transistor T1 to operate. In this way, the pixels would operate normally, so that display effect of the display panel can be raised and production yield of the display panel is enhanced.

Alternatively, the control terminal of the standby driving transistor T3 in the embodiment can further be selected to be connected to the control terminal of the driving transistor T1 through the second capacitor C2, such that it is simpler when repairing, and the control terminal of the standby driving transistor T3 can be connected to the control terminal of the driving transistor T1 only if the two electrode plates of the second capacitor C2 are short-circuited.

There is further provided in an embodiment of the present disclosure a display panel. The display panel comprises a plurality of pixels, each of which includes a plurality of sub-pixels. An display unit is arranged within each sub-pixel. The driving circuit described above is also arranged within the sub-pixel to drive the display unit. In the display panel provided in the embodiment of the present disclosure, when the sub-pixels fail to be display normally due to occurrence of abnormality to the driving transistor T1, it is able to make the standby driving transistor T3 to take place of the original driving transistor T1 to operate by repairing. In this way, the sub-pixels would operate normally, so that display effect of the display panel can be raised and production yield of the display panel is enhanced.

Normally, the sub-pixel driving unit constituted of the switching transistor T2, the driving transistor T1, the storage capacitor C and the display unit 10 operate, and the standby driving transistor 11 performs as redundant. Therefore, in case of ensuring that each sub-pixel can be repaired, the number of the standby driving transistor 11 shall be reduced as much as possible so as to reduce circuit complexity. Therefore, alternatively, it may select that two or more adjacent sub-pixels share one standby driving unit 11. When abnormality occurs to the driving transistor T1 of one of these adjacent sub-pixels, the standby driving transistor T3 in the shared standby driving unit 11 can be used to replace by repairing.

Figure 3:
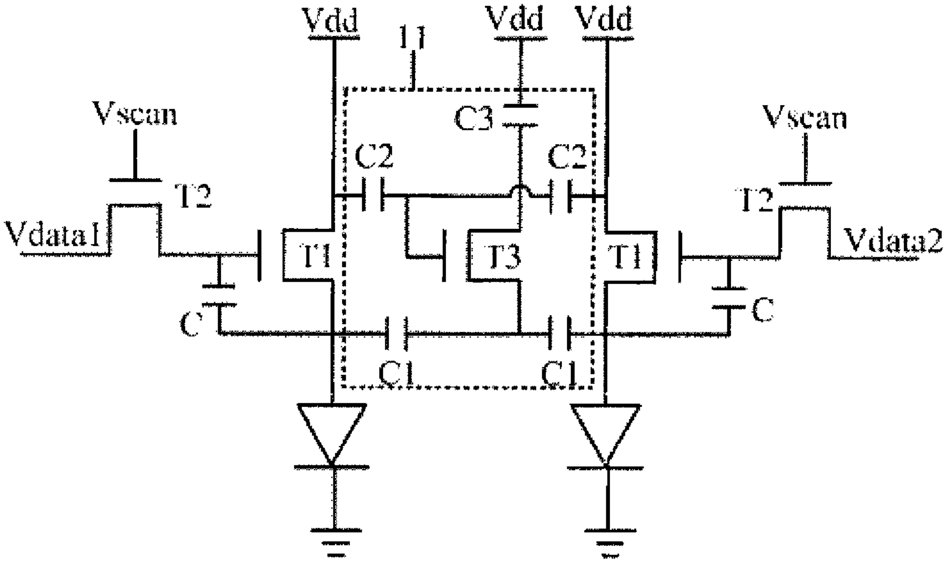
FIG. 3 is a schematic diagram of a driving circuit of two adjacent sub-pixels of a display panel provided in an embodiment of the present disclosure.

Exemplarily, FIG. 3 shows a schematic diagram of a driving circuit of two adjacent sub-pixels of a display panel provided in an embodiment of the present disclosure. As shown in FIG. 3, the two adjacent sub-pixels share one standby driving unit 11. The display unit 10 in the two adjacent sub-pixels is connected to the second terminal of the standby driving transistor T3 in the shared standby driving unit 11 through a first capacitor C1 respectively; the first terminal of the driving transistor T1 in the two adjacent sub-pixels is connected to the control terminal of the standby driving transistor T3 in the shared standby driving unit 11 through a second capacitor C2 respectively (of course, it may also be selected that the control terminal of the driving transistor T1 in the two adjacent sub-pixels is connected to the control terminal of the standby driving transistor T3 in the shared standby driving unit 11 through a second capacitor C2 respectively).

In addition, it needs to indicate that the pixel driving circuit described above can further comprise other units or elements, for example, a compensation unit configured to compensate for current difference caused by non-uniformity and drifting of a threshold voltage Vth and non-uniformity of OLED. Since it is not directly related to the present disclosure, the present embodiment omits its description for the purpose of simplicity and clarity.

There is further provided in an embodiment of the present disclosure a repairing method of the display panel described above, which is applicable to poor display caused by that a pixel driving circuit cannot operate normally due to occurrence of abnormality to the driving transistor.

Figure 4:
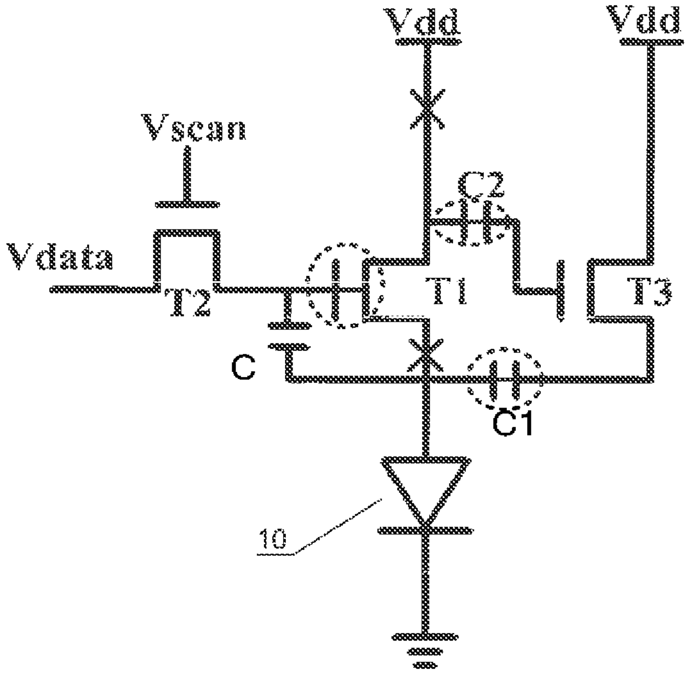
FIG. 4 is a schematic diagram of repairing of the pixel driving circuit as shown in FIG. 2.
Figure 5:
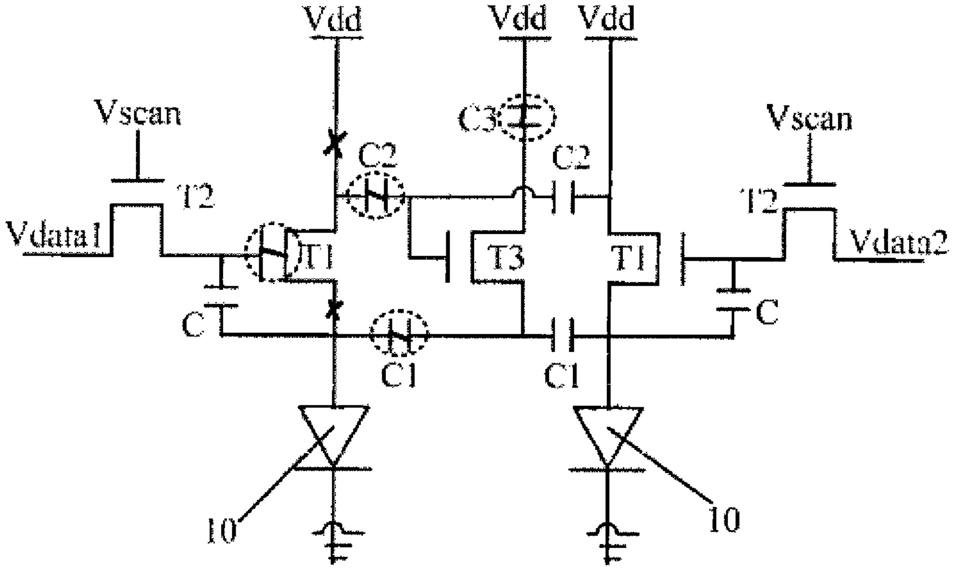
FIG. 5 is a schematic diagram of repairing of the pixel driving circuit as shown in FIG. 3.

FIG. 4 shows a schematic diagram of repairing of the pixel driving circuit as shown in FIG. 2. FIG. 5 shows a schematic diagram of repairing of the pixel driving circuit as shown in FIG. 3. By referring to FIGS. 4 and 5, the repairing method comprises following steps:

Step 1: disconnecting the first terminal of the driving transistor T1 where abnormality occurs from wiring of power supply signal terminal by means of laser cutting, and disconnecting the second terminal of the driving transistor T1 where abnormality occurs from the display unit 10, the wiring of power supply signal terminal being used to input the power supply signal Vdd to the driving transistor T1.

The driving transistor T1 where abnormality occurs is disconnected from other parts of the driving circuit through the above step.

Step 2: welding the two electrode plates of the first capacitor C1 together and welding the two electrode plates of the second capacitor C2 together by means of laser welding. It further needs to weld the control terminal of the driving transistor T1 and the first terminal of the driving transistor T1 together if the control terminal of the standby driving transistor T3 is connected to the first terminal of the driving transistor T1 through the second capacitor C2.

The third terminal of the standby driving transistor T3 is correspondingly connected to other parts of the driving circuit through the above steps, so that the standby driving transistor T3 takes place of the driving transistor T1 where abnormality occurs to operate. If the control terminal of the standby driving transistor T3 is connected to the control terminal of the driving transistor T1 through the second capacitor C2, in the case of repairing, it only needs to weld the two electrode plates of the second capacitor C2 together, then the data signal Vdata can be input to the control terminal of the standby driving transistor T3 under the control of the switching transistor T2. If the control terminal of the standby driving transistor T3 is connected to the first terminal of the driving transistor T1 through the second capacitor C2, in the case of repairing, it not only needs to weld the two electrode plates of the second capacitor C2 together but also needs to weld the control terminal of the driving transistor T1 and the first terminal of the driving transistor T1 together, so that it can be ensured the data signal Vdata is input to the control terminal of the standby driving transistor T3 under the control of the switching transistor T2. The detailed situation of repairing is as shown in FIG. 4, cross points in the figure represent that it is the cutting point, and a position of the dashed line box in the figure represents that this position is welded together. After repairing, the bright points or dark points previously caused by failed operation of the driving transistor T1 would recover to a normal display state.

As shown in FIG. 5, the two adjacent sub-pixels share one standby driving unit 11 (the same as FIG. 3, not indicated herein). When abnormality occurs to the sub-pixel driving transistor T1 on the left side, similarly, in the case of repairing, it needs to disconnect the first terminal of the driving transistor T1 where abnormality occurs from the wiring of power supply signal terminal, disconnect the second terminal of the driving transistor T1 from the display unit 10, weld the two electrode plates of the first capacitor C1 together, weld the two electrode plates of the second capacitor C2 together, and weld the two electrode pates of the third capacitor C3 together. In addition, it also needs to weld the control terminal of the driving transistor T1 and the first terminal of the driving transistor T1 together. In the case of no repairing is needed, the standby driving unit 11 is a redundancy unit. In the present embodiment, in order to avoid the power supply signal from influencing the original driving circuit through the standby driving transistor T3, the first capacitor C1 and the second capacitor C2, a third capacitor C3 can further be connected between the first terminal of the standby driving transistor T3 and the wiring of power supply signal terminal, and in the case of repairing, it also needs to weld the two electrode plates of the third capacitor C3 together.

Alternatively, the display panel is formed by box aligning of an array substrate and a protection substrate; laser cutting or laser welding is performed at one side of the array substrate.

The embodiments of the present disclosure do not limit the specific structure of the driving circuit, which may be any specific structure well known for those skilled in the art only if it comprises the standby driving unit as described in the present embodiment.

The display panel and a repairing method thereof further provided in an embodiment of the present disclosure are capable of making pixels operate normally by means of repairing when abnormal circumstance occurs to a driving transistor, so that display effect of a display panel can be raised and production yield of the display panel is enhanced. The display panel can be any product or means having the display function such as an electronic paper, an OLED panel, a mobile phone, a tablet computer, a television set, a display, a notebook computer, a digital photo frame, a navigator or the like.

Respective embodiments in the specification are described progressively, same or similar parts of the respective embodiments can refer to each other, and each embodiment mainly describes the differences than other embodiments. In particular, for an apparatus embodiment, since it is basically similar to a method embodiment, it is described simpler, and thus its relevant points would refer to a part description of the method embodiment.

The above descriptions are just specific implementations of the present disclosure, but the protection scope of the present disclosure is not limited thereto. Any alternation or replacement that can be easily conceived by those skilled in the art who are familiar with the present technical field within the technical range disclosed in the present disclosure shall be covered within the protection scope of the present disclosure. Therefore, the protection scope of the present disclosure shall be subjected to the protection scope of the claims.

The present application claims the priority of a Chinese patent application No. 201510112627.0 filed on Mar. 13, 2015. Herein, the content disclosed by the Chinese patent application is incorporated in full by reference as a part of the present disclosure.

What is claimed is:

1. A pixel driving circuit, comprising:

a driving transistor, whose first terminal is connected to a power source to receive a power supply signal, second terminal is connected to a display unit, and control terminal receives a data signal; and a standby driving unit including a standby transistor and two capacitors, wherein a first terminal of the standby driving transistor is connected to the power source to receive the power supply signal, a second terminal thereof is connected to a first terminal of a first capacitor of the two capacitors and a second terminal of the first capacitor is connected to the display unit, and a control terminal of the standby driving transistor is connected to a first terminal of a second capacitor of the two capacitors and a second terminal of the second capacitor is connected to the first terminal of the driving transistor.

2. The pixel driving circuit according to claim 1, wherein a control terminal of the standby driving transistor is connected to the control terminal of the driving transistor though the second capacitor.

3. The pixel driving circuit according to claim 1, wherein the display unit is an organic light emitting diode.

4. A display panel, comprising a plurality of pixels, each of which includes a plurality of sub-pixels, a display unit being arranged within each of the sub-pixels, wherein the driving circuit according to claim 1 is also arranged within the sub-pixel to drive the display unit.

5. The display panel according to claim 4, wherein two or more adjacent sub-pixels share the standby driving unit.

6. The display panel according to claim 5, wherein the two adjacent sub-pixels share the standby driving unit;

a display unit in the two adjacent sub-pixels is connected to the second terminal of the standby driving transistor in the shared standby driving unit through the first capacitor respectively.

7. The display panel according to claim 6, wherein the control terminal of the driving transistor in the two adjacent sub-pixels is connected to the control terminal of the standby driving transistor in the shared standby driving unit through the second capacitor respectively.

8. The display panel according to claim 6, wherein the first terminal of the driving transistor in the two adjacent sub-pixels is connected to the control terminal of the standby driving transistor in the shared standby driving unit through the second capacitor respectively.

9. The pixel driving circuit according to claim 2, wherein the display unit is an organic light emitting diode.

10. The display panel according to claim 4, wherein a control terminal of the standby driving transistor is connected to the control terminal of the driving transistor though the second capacitor.

11. The display panel according to claim 4, wherein the display unit is an organic light emitting diode.

12. The display panel according to claim 10, wherein the display unit is an organic light emitting diode.

* * * * *